United States Patent [19]

Kawano et al.

[11] Patent Number: 5,012,183
[45] Date of Patent: Apr. 30, 1991

[54] ELECTROOPTIC EFFECT ELEMENT AND ELECTRICAL SIGNAL WAVEFORM MEASURING APPARATUS USING THE SAME

[75] Inventors: Youzo Kawano, Ebina; Tadashi Takahashi, Atsugi; Yasuhiko Shimura, Hatano; Yukihiro Takahashi, Atsugi, all of Japan

[73] Assignee: Anritsu Corporation, Tokyo, Japan

[21] Appl. No.: 391,548

[22] PCT Filed: Oct. 21, 1988

[86] PCT No.: PCT/JP89/01071
§ 371 Date: Jul. 10, 1989
§ 102(e) Date: Jul. 10, 1989

[87] PCT Pub. No.: WO88/12831
PCT Pub. Date: Dec. 28, 1989

[30] Foreign Application Priority Data

Jun. 22, 1988 [JP] Japan .................. 63-154327

[51] Int. Cl.$^5$ .................. G01R 19/00; G01R 23/16
[52] U.S. Cl. .................. 324/96; 324/77 K; 350/374; 350/384
[58] Field of Search ........... 324/96, 77 K; 350/374, 350/376, 384, 355

[56] References Cited

U.S. PATENT DOCUMENTS

| | | | |
|---|---|---|---|
| 3,614,451 | 10/1971 | Gunn | 324/96 |
| 3,619,031 | 11/1971 | Amodel | 350/374 |
| 3,701,584 | 10/1972 | Runge | 350/384 |
| 4,157,860 | 6/1979 | Marcatili | 350/374 |
| 4,222,638 | 9/1980 | Robert | 350/374 |
| 4,306,142 | 12/1981 | Watanabe et al. | 350/384 |
| 4,446,425 | 5/1984 | Valdmanis et al. | 324/96 |
| 4,514,046 | 4/1985 | Carlsen et al. | 350/355 |
| 4,603,293 | 7/1986 | Mourou et al. | 324/96 |

FOREIGN PATENT DOCUMENTS

| | | |
|---|---|---|
| 58-216963 | 12/1983 | Japan . |
| 59-500186 | 2/1984 | Japan . |
| 59-160770 | 9/1984 | Japan . |
| 60-253878 | 12/1985 | Japan . |
| 62-150173 | 7/1987 | Japan . |

OTHER PUBLICATIONS

Nakanishi et al, Institute of Electronics and Communication Engineers of Japan, the 70th Anniversary National Meeting, Lecture Papers 266, 3/87.
33rd Joint Lecture associated with the Japan Society of Applied Physics, 1986 Spring, Papers 3p-t-8, 4/86.

Primary Examiner—Kenneth Wieder
Assistant Examiner—William J. Burns
Attorney, Agent, or Firm—Frishauf, Holtz, Goodman & Woodward

[57] ABSTRACT

An electrooptic effect element of this invention has first, second, and third electrodes. The first and second electrodes are formed on a substrate having an electrooptic effect, in order to form a high-frequency electric field for polarizing a light beam, thus constituting a microstrip line, as in the conventional element. The third electrode is spaced apart from the second electrode on the substrate in order to form another electric field for canceling the polarized light by the high-frequency electric field. In an electrical signal waveform measuring apparatus of this invention, an electrical signal obtained from an optical detection system coupled to the electrooptic effect element is fed back to form a closed loop in the third electrode.

5 Claims, 7 Drawing Sheets

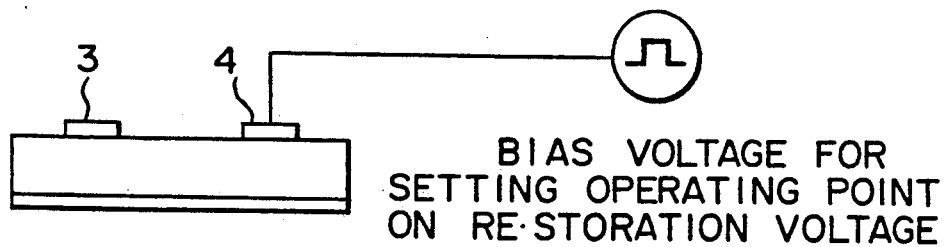
F I G. 4A
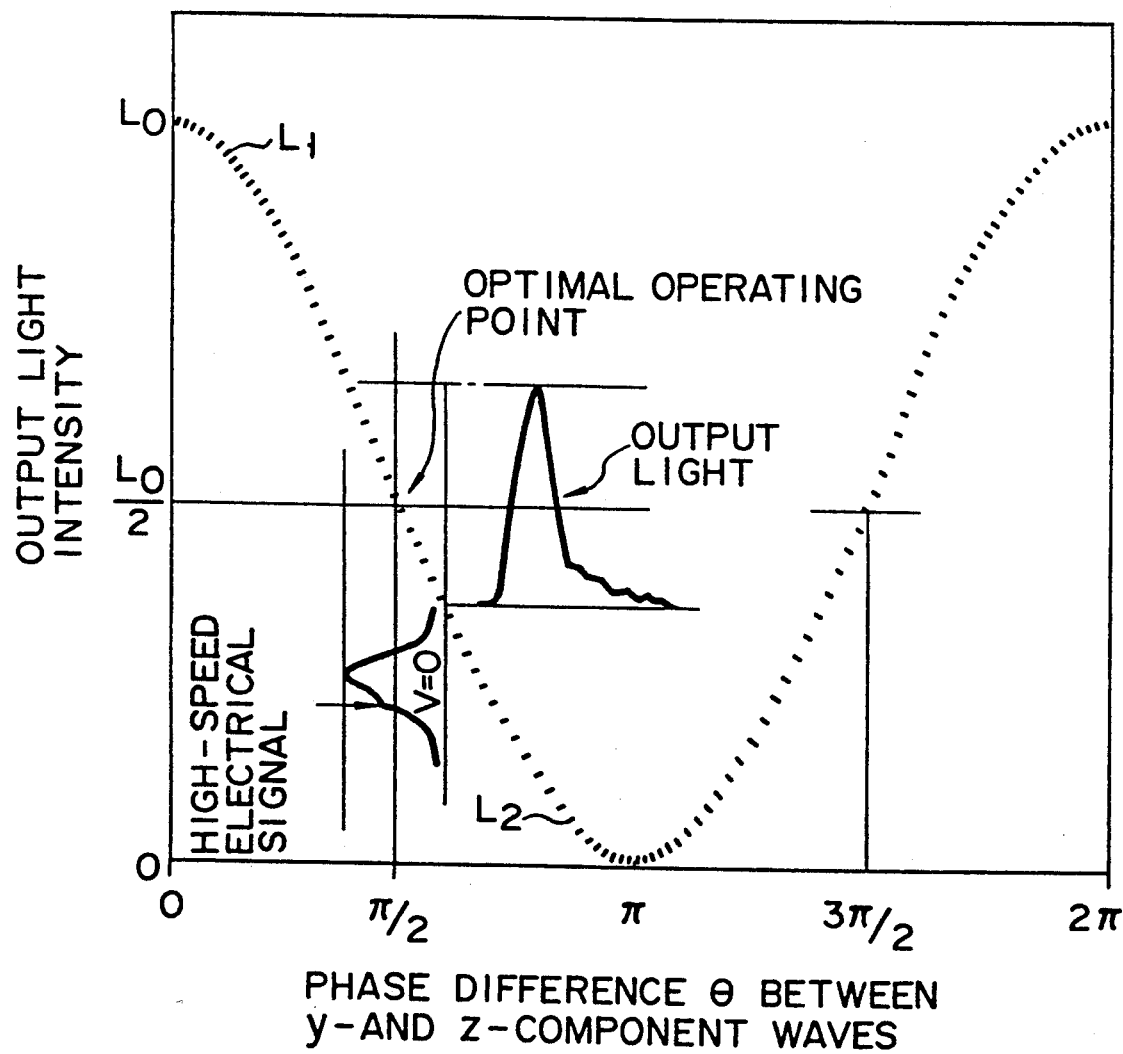
F I G. 4B

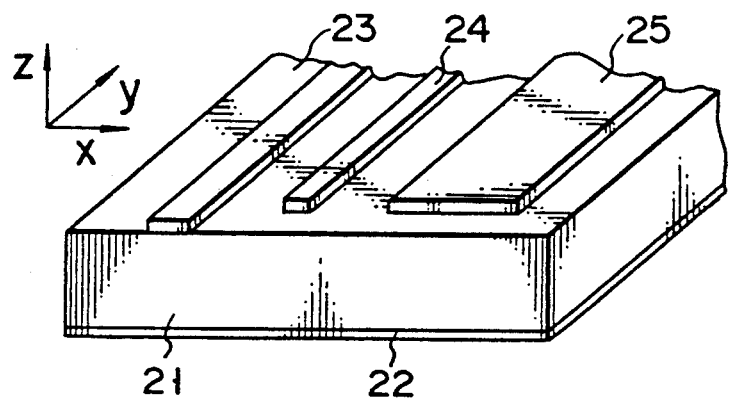
FIG. 5
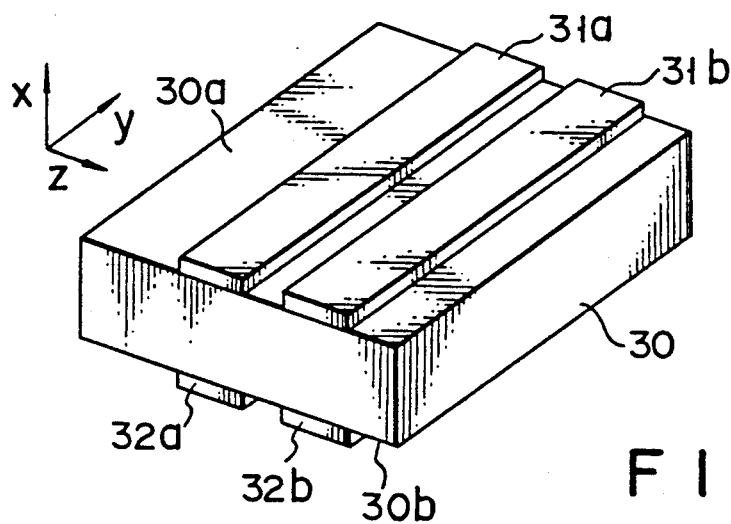
FIG. 6
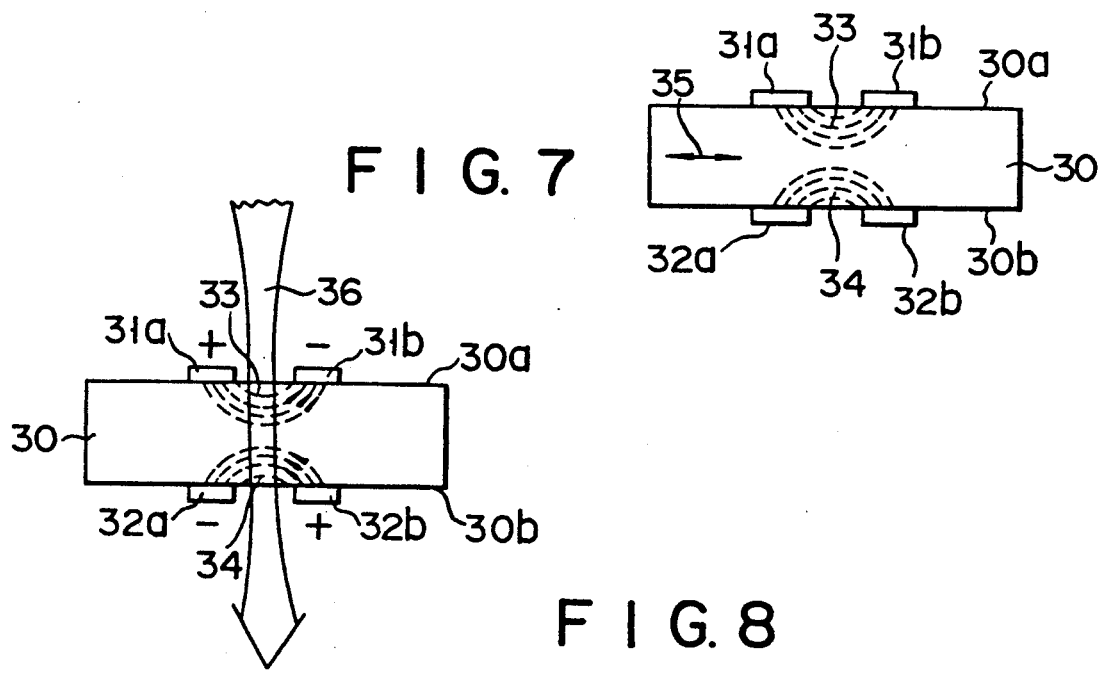
FIG. 7
FIG. 8

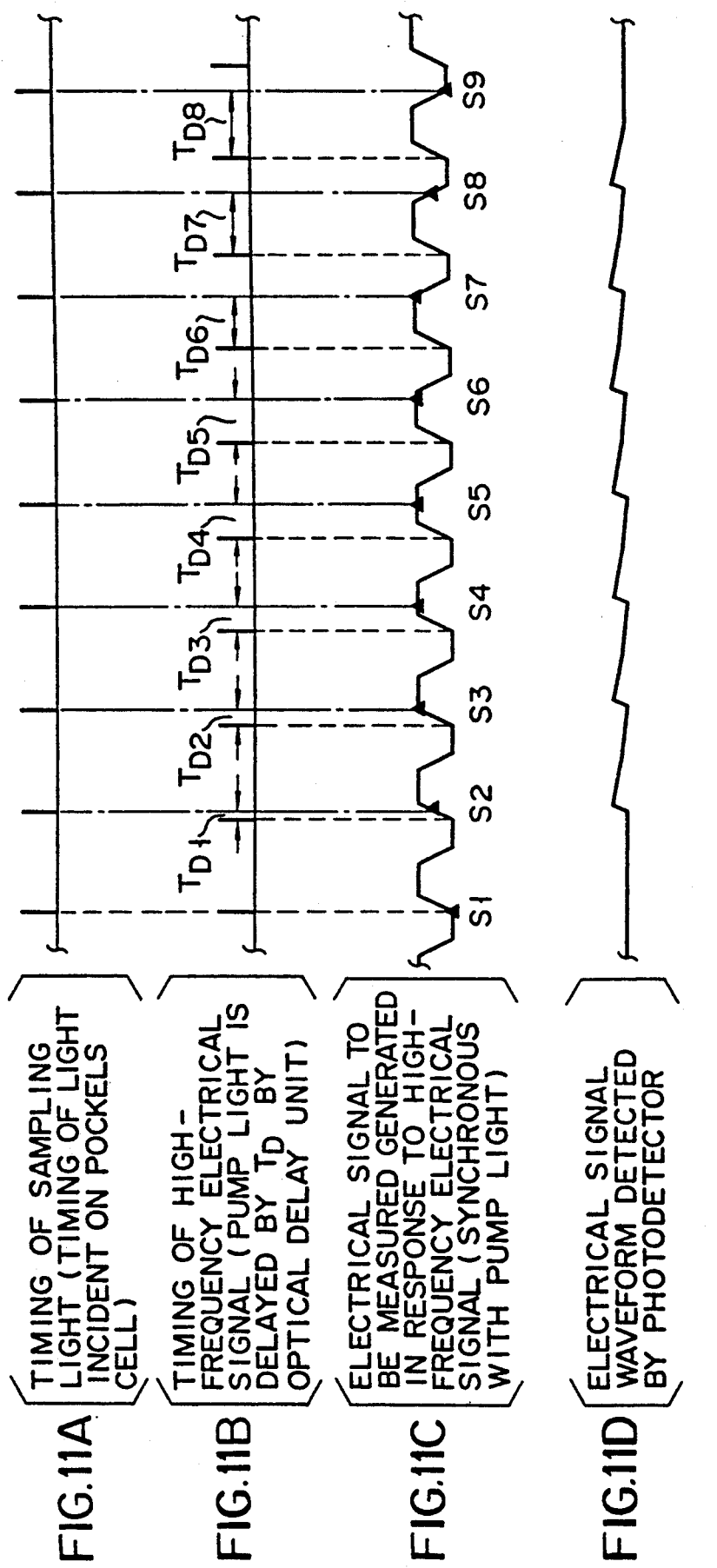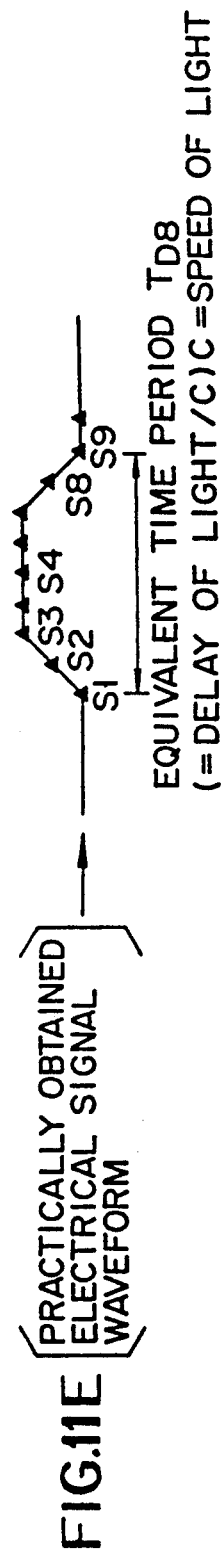

ELECTROOPTIC EFFECT ELEMENT AND ELECTRICAL SIGNAL WAVEFORM MEASURING APPARATUS USING THE SAME

BACKGROUND OF INVENTION

The present invention relates to an electrooptic effect element and an electrical signal waveform measuring apparatus using the same and, more particularly, to improvement of an electrooptic effect element known as one of external optical modulators, and an electrical signal waveform measuring apparatus utilizing an E-O sampling (Electrooptic Sampling) system for measuring an electrical signal by light using the high-speed response characteristics of the improved electrooptic effect element and a technique for obtaining ultrashort light pulse having a pulse duration shorter than one picosecond.

In recent years, a high-speed electronic device has been remarkably improved In particular, a switching speed of an HBT (Heterojunction Bipolar Transistor) utilizing a compound semiconductor heterojunction at room temperature reaches 2.5 picosecond. In general, an electronic sampling oscilloscope is used as a measuring apparatus for estimating the switching speed of socalled ultrafast device However, the accuracy of this measuring apparatus is limited to a switching speed of a semiconductor device in a sampling head. Therefore, the capability of this measuring apparatus is insufficient to measure the speed of the ultrafast device, as a matter of course. For this reason, an attempt has been recently made to improve time resolution by employing a sampling head utilizing a Josephson junction (e.g., the Institute of Electronics and Communication Engineers of Japan, the 70th Anniversary National Meeting, Lecture Papers 266, 1989, Nakanishi et al.). According to the papers, it is inevitable that the structure of the measuring apparatus is complicated because a specific cryoelectronics (very low temperature technique) is required.

In the above situations, therefore, the following method is employed in many cases. That is, several tens of the ultrafast devices are connected to each other to constitute, e.g., a ring oscillator as a typical example, and a switching speed of each device is calculated based on the oscillating frequency of the ring oscillator (e.g., the 33th Joint Lecture associated with the Japan Society of Applied Physics, 1986 Spring, Papers 3p-t-8).

According to this method, although average characteristics of a large number of devices can be obtained, the characteristics of the individual devices, e.g., a leading waveform of a specific device cannot be observed.

An E-O sampling system utilizing light is proposed in place of the above method. This E-O sampling technique utilizing light is disclosed in the specification of an early U.S. Pat. No. 3,614,451 issued to Gunn in 1968. A measuring method of an electrical signal using a traveling wave electrooptic modulator utilizing an electrooptic effect element and ultrashort light pulse is disclosed in the above U.S.P. literature. In particular, according to this literature, the traveling directions of an electrical signal and the light pulse are inclined, so that the phase velocity of the electrical signal to be measured is equal to the group velocity of the light pulse in the traveling direction of the electrical signal, thus improving time resolution.

According to thus disclosed technique, however, a countermeasure against a change in output level of a light source of the ultrashort light pulse, temperature drift of the electrooptic effect element, or the like is not taken at all. Therefore, a high-precision E-O sampling system cannot be realized, and stable measurement cannot be performed. Thereafter, as a light source of the ultrashort light pulse has been improved and developed, this E-O sampling system has received a great deal of attention again as a waveform measuring system having a high time resolution. Several electrical signal measuring systems (PCT Publication No. 59-500186 and Japanese Patent Publication No. 60-253878, and U.S. Pat. Nos. 4,446,425 and 4,603,293) utilizing a Traveling-wave (TW) electrooptic effect element were disclosed by Mourou and Valdmanis.

The electrical signal measuring system by the E-O sampling method utilizing the above-mentioned conventionally known electrooptic effect element, however, has the following problems which have not been solved.

(1) The refractive index of a material for an electrooptic effect element is largely changed in accordance with a change in ambient temperature.

(2) When the electrooptic effect element is manufactured, it is difficult to obtain a preferable incident surface of a light beam.

(3) A change (drift) in output characteristics (e.g., an intensity or a wavelength) of ultrashort light pulse is inevitable.

(4) When an E-O sampling system is constituted by an optical system including a polarizer, the electrooptic effect element, an analyzer, and a photodetector, the perfect linear characteristics between the input and output characteristics of the E-O sampling system cannot be obtained.

(5) Temperature drift of the entire optical system and the photodetector are inevitable.

(6) In the entire system, it is difficult to set an operating point of the electrooptic effect element, and in particular, to perform fine adjustment of a compensator for compensating static birefringence.

(7) Since it takes about ten minutes to perform sampling for each waveform measurement, drift in the sampling time is inevitable.

(8) A sampling level need be corrected upon every replacement operations of a light pulse source.

As a result, the above problems (1) to (6) undesirably cause degradation of the E-O sampling system. The above problems (5) to (8) undesirably cause unstable measurement.

SUMMARY OF INVENTION

It is an object of the present invention to positively solve all the above problems. In particular, it is one object to provide an improved electrooptic effect element having a plurality of electrodes (e.g., restore and control electrodes). It is another object of this invention to provide an electrical signal waveform measuring apparatus for measuring an electrical signal waveform with high precision (high accuracy) by using the improved electrooptic effect element.

In order to achieve the above one object, according to the present invention, there is provided an electrooptic effect element basically having three electrodes.

A first electrode is formed on one of opposite surfaces of a substrate made by a material having an electrooptic effect to exhibit a function of a common or ground electrode.

A second electrode is formed on the other of the opposite surfaces the substrate. The second electrode makes a pair together with the first electrode to transmit a high-speed electrical signal to be supplied between the first and second electrodes, thus forming a high-frequency electric field in the substrate by the high-frequency electrical signal.

A third electrode is slightly spaced apart from and adjacent to the second electrode. The third electrode makes a pair together with the first electrode to form an electric field different from that formed by the second electrode in the substrate by another electric field (not always to be limited to a high-frequency electric field, but may be a low-frequency or a DC electric field) to be applied between the first and third electrodes. A light beam passes through the substrate and is polarized (receives an electrooptic effect) due to an influence of the electric fields formed by these two pairs of electrodes.

In order to achieve the above-mentioned another object, according to the present invention, there is provided an electrical signal waveform measuring apparatus using the electrooptic effect element. This measuring apparatus employs the following circuit system.

Assume that a light beam passe through the substrate consisting of the electrooptic effect element. A difference between the level of an electrical signal detected when the light beam is polarized by a voltage of the high-speed electrical signal supplied to the second electrode and the level of the electrical signal detected when a voltage is not applied to the second and third electrodes, i.e., polarization is not performed is detected and amplified. Based on the detection result of this level difference, a voltage which can cancel a voltage corresponding to a polarized component polarized at the second electrode is applied to the third electrode. Such a feedback loop (closed loop) is formed, so that the voltage applied to the third electrode is measured as a part of the electrical signal to be measured. In addition, in the electrical signal waveform measuring apparatus according to the present invention, a chopper for chopping the electrical signal to be measured and the voltage applied to the third electrode is prepared in order to achieve the above-mentioned closed-loop operation, to apply the voltage to the third electrode in synchronism with a polarization timing at the second electrode, and to improve a detection sensitivity by employing a sync-detector system.

BRIEF DESCRIPTION OF DRAWINGS

The above, and other objects and features of the present invention can be understood from the following description of embodiments with reference to the accompanying drawings, in which:

FIG. 4A is a view showing an example that a bias voltage for setting an operating point is superposed on a demodulation voltage and the resultant voltage is applied to a restore electrode on the substrate;

FIG. 4B is a graph showing a relationship between a phase difference 8 between two polarized components of input light and an output light intensity;

FIG. 5 is a perspective view of an electrooptic effect element according to a second embodiment of the present invention;

FIG. 6 is a perspective view of an electrooptic effect element according to a third embodiment of the present invention;

FIG. 7 is a view showing electric field distribution formed in a substrate shown in FIG. 6;

FIG. 8 is a view showing input and output directions of a light beam in the substrate shown in FIG. 6;

FIGS. 11A to 11E are timing charts showing sampling operations.

DETAILED DESCRIPTION

Embodiments of the present invention will be described hereinafter in detail with reference to the accompanying drawings.

FIRST EMBODIMENT

Figure 1:
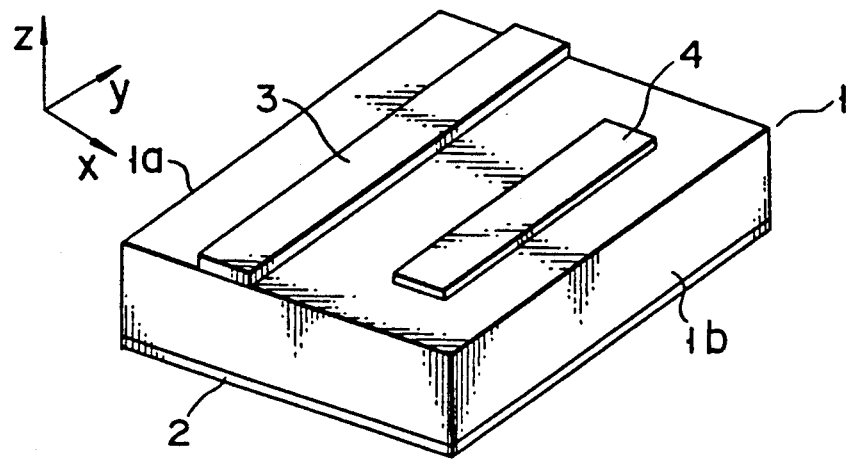
FIG. 1 is a perspective view of an electrooptic effect element according to a first embodiment of the present invention.
Figure 2A:
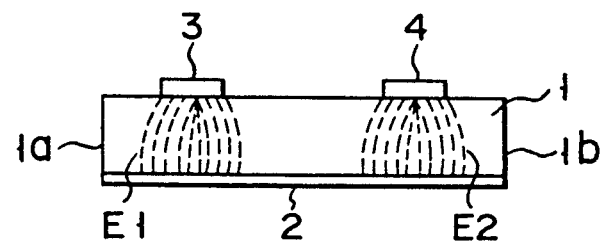
FIG. 2A is a view showing electric field distribution in a substrate shown in FIG. 1.
Figure 2B:
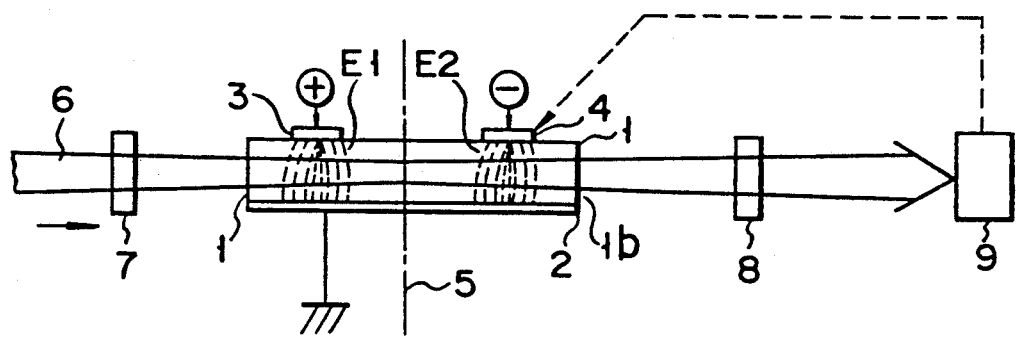
FIG. 2B is a view showing a state wherein a light beam passes through the substrate shown in FIG. 1.

FIG. 1 shows an electrooptic effect element (microstrip-type) according to a first embodiment of the present invention. A substrate 1 consists of a material such as lithium tantalate, lithium niobate, or gallium arsenide having an electrooptic effect. For example, a thin substrate having a width of about 1 to 2 mm, a length of about 10 mm, and a thickness of about 250 $\mu$m is easily formed. Light input and output surfaces 1a and 1b are optically polished, i.e., mirror-polished. A first electrode 2 is formed on an entire bottom surface, opposite an upper surface of the substrate 1 by a thin film formation technique such as vacuum evaporation, sputtering, or electroless plating. Second and third electrodes (microstrip-line electrodes) 3 and 4 each having a width of, e.g., 250 $\mu$m are formed on the upper surface of the substrate 1 by a micropatterning technique such as a thin film formation technique, a photolithographic technique, or a lift-off technique. The second and third electrodes 3 and 4 are arranged parallel to the longitudinal direction of the light input and output surfaces 1a and 1b, and are spaced apart from each other by a predetermined interval. The second electrode 3 forms a transmission line (microstrip-line) for transmitting a TEM wave at a desired impedance, together with the first electrode 2. Therefore, as shown in FIG. 2A, an electric field E1 corresponding to a voltage of a high-speed electrical signal to be applied between the electrodes 2 and 3 is formed in a part sandwiched by the electrodes 2 and 3 in the substrate 1. The third electrode 4 is arranged to form an electric field E2 different from the electric field E1 formed by the second electrode 3 between the third and first electrodes 4 and 2 in the substrate 1. As shown in FIG. 1, the third electrode 4 need not always form a transmission line covering the entire length of the substrate 1, but the electric field E2 may be slightly spaced apart from the electric field E1 formed by the second electrode 3. For example, the directions of the electric fields E1 and E2 must be parallel to the z-axis in a uniaxial crystal to obtain a high phase modulation degree of the light even if a low voltage is applied. In the first embodiment, a light beam 6 passes through the substrate 1 in a direction indicated by an arrow in FIG. 2B, while being subjected to phase modulation based on an electrooptic effect by the electric fields E1 and E2 respectively formed under the second and third electrodes 3 and 4. This light beam (its traveling direction is represented by "x") passes through a polarizer 7 before incidence on the substrate 1. Therefore, the phases of two polarized components (y- and z-component waves) coincide with each other, i.e., a linear polarization state is provided. The light beam 6 is incident on a polarization definition plane by 45° with respect to a substrate crystallographic axis (z-axis). When the light beam 6 passes under the second electrode 3, a phase difference $\theta$ between the y- and z-component waves is generated by a birefringence effect of the substrate due to the voltage of the high-speed electrical signal applied to the electrode 3, and the light beam 6 is modulated from a linear polarization state to an elliptical polarization state. When the light beam 6 passes under the third electrode 4, the light beam 6 receives birefringence effect as in the above case wherein the light beam passes under the second electrode 3. However, if the polarity of the voltage applied to the third electrode 4 is opposite to that of the voltage of the high-speed electrical signal applied to the second electrode 3, a phase difference 8 between the y- and z-component waves is corrected to be a smaller value. More specifically, the original linear polarization state is obtained (re-storation). When the electric fields under the electrodes are symmetrical about an axis 5 and only the directions of the electric fields are reversed, the complete original linear polarization state can be obtained. According to the present invention, using the above method, the third electrode 4 serves as a re-store electrode for returning a change of the light generated at the second electrode 3 to the original state. A measurement operation is performed by the following methods.

When the voltage of a high-speed electrical signal is applied to the second electrode 3 as an electrical signal to be measured, the polarization state of a light beam output from the substrate 1 is monitored through an analyzer 8 and a photodetector 9. At the same time, a known voltage for re-storation is fed back to the third electrode 4 to obtain the state wherein the voltage of the high-speed electrical signal is not applied to the second electrode 3.

More specifically, therefore, the voltage value (known) applied to the third electrode 4 when the complete original polarization state of the light is obtained can serve as the voltage of a part of the high-speed electrical signal applied to the second electrode 3. Therefore, a sampling point is gradually shifted and the known voltage values of all points are obtained, so that the entire electrical signal to be measured can be ultimately measured (observed). Monitoring of the polarization state is achieved by analyzer 8 converting a phase difference between the y- and z- component waves into a change in light intensity, and by photodetector 9 detecting the change in light intensity. For example, a Glan-Thompson prism is utilized as the analyzer 8. When a Wollaston prism can be used in place of the Glan-Thompson prism, a difference between two output light beams having polarization definition planes perpendicular to each other can be obtained. In this case, the detection sensitivity can be further improved, and an influence of a change in light intensity of the light source can be reduced.

As described above, the electrooptic effect element according to the first embodiment of the present invention has three electrodes to perform feedback (closed-loop) compensation of the detector system. Therefore, as a first feature of the electrooptic effect element, its detection sensitivity depends on only the resolution of the detector system. Therefore, the detection sensitivity can be remarkably improved, as compared with the conventional electrooptic effect element without such three electrodes. In addition, all the problems of the conventional E-O sampling system because of its compensation-type measurement principle, such as a nonlinear characteristics between the input and output characteristics and degradation in measurement precision due to drawbacks drived from fabrication of the electrooptic effect element can be solved.

Figure 3:
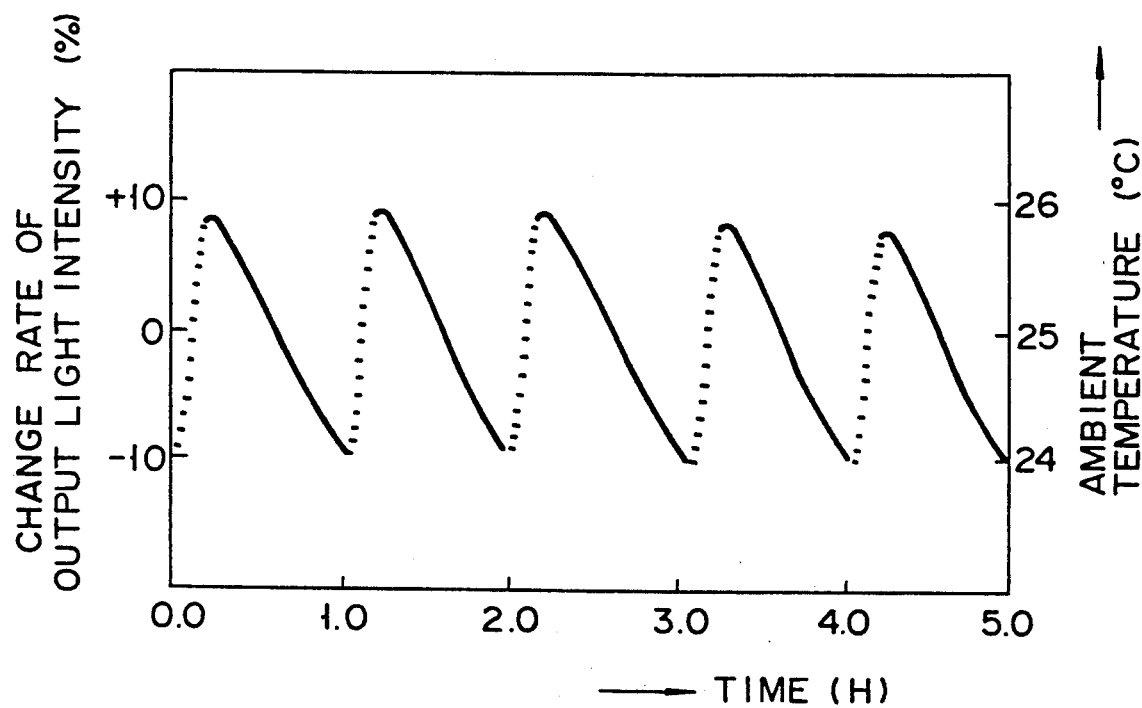
FIG. 3 is a graph showing relationship between a change in ambient temperature and a change in output light intensity in a conventional electrooptic effect element.

It is another feature of the electrooptic effect element having three electrodes for feedback compensation that drift due to a change in ambient temperature can be prevented. More specifically, the drift generated in the second electrode is canceled by drift simultaneously generated in the third electrode. This feature will be described below in contrast to the conventional electrooptic effect element. FIG. 3 is a graph showing a percentage of a change in output light intensity with respect to the input light intensity when the ambient temperature is changed by 2° C./hour in the conventional electrooptic effect element. More specifically, as is apparent from FIG. 3, the rate of a change in output light intensity of the conventional electrooptic effect element is 10% with respect to a change in ambient temperature by 1° C. As compared with the rate of a change in output light intensity of 1% when a voltage of 1 V is applied to the second electrode, this rate of a change 10% is considerably a large value. Therefore, an influence of the change in ambient temperature cannot be ignored for the electrooptic effect element of this type. In order to solve the above problems without three electrodes for feedback compensation of the present invention, since the ambient temperature must be kept within the range of variations of at least $10^{-2}$ to $10^{-3}$° C., a total cost is undesirably increased. The electrooptic effect element having the third electrode for feedback compensation according to the present invention can easily cancel an influence due to a change in ambient temperature without failure.

FIGS. 4A and 4B show an example that an operating point setting voltage (e.g., a DC voltage may be used) is superposed on the re-storation voltage and the resultant voltage is applied to the third electrode 4, so that the most effective operating point for the electro-optic effect is selected.

A setting operation of the operating point will be briefly described hereinafter.

An output light intensity L from an analyzer can be obtained as follows:

$$L = (L_0/2)(1 + \cos\theta) \quad \ldots (1)$$

where $L_0$ is an intensity of light incident on the electrooptic effect element, and $\theta$ is a phase difference between two polarized components, i.e., y- and z- component waves. Its experimental result is shown in FIG. 4B.

As is understood from the above equation (1) and FIG. 4B, when a voltage of a high-speed electrical signal is not applied to the second electrode 3, an operating point setting voltage for setting an operating point is applied to the third electrode 4 to set an optimal operating point. More specifically, a phase difference θ between y- and z-component waves is set at π/2 or 3π/2 in advance and the output light intensity is set at (L₀/2). Therefore, when the voltage of the high-speed electrical signal to be measured is applied to the second electrode 3, the highest output sensitivity can be obtained, as compared with the case wherein the operating point is set at a point $L_1$ or $L_2$ in FIG. 4B. In addition, a linear output light with respect to the voltage can be obtained.

SECOND EMBODIMENT

FIG. 5 shows an electrooptic effect element according to a second embodiment of the present invention. The third electrode 4 in the first embodiment is constituted by a plurality of third electrodes 4 in the second embodiment. More specifically, in the second embodiment, the third electrode 4 in the first embodiment is constituted by two electrodes, i.e., a re-store electrode 24 for monitoring a part of a voltage of a high-speed electrical signal applied to a second electrode 23, and a control electrode 25 for setting an optimal operating point. The re-store electrode 24 preferably has the same width as that of the second electrode 23 for the sake of a simple electric circuit system for operating the electrooptic effect element.

On the other hand, the control electrode 25 is not associated with light re-storation. Therefore, the width of the electrode 25 can be freely set regardless of that of the second electrode 23.

A phase change (θ) in light beam passing through a substrate under the control electrode 25 is defined as follows:

$$\theta = (2\pi/\lambda)nl \qquad \ldots (2)$$

where n is a refractive index of the substrate, λ is the wavelength of the light beam, and l is an electrode width. As can be understood from the equation (2), without applying the voltage to change n to control θ, the width l is increased so that θ can be controlled. Therefore, according to the second embodiment, the width of the control electrode 25 is increased, so that the voltage to be applied to the control electrode 25 so as to set an operating point can be reduced.

THIRD EMBODIMENT

FIG. 6 shows an electrooptic effect element (coplanar-type) according to a third embodiment of the present invention. A substrate 30 is formed by a material having an electrooptic effect, such as lithium tantalate, lithium niobate, or gallium arsenide. Upper and lower surfaces 30a and 30b of the substrate 30 are optically polished. First coplanar strips 31a and 31b are formed on the upper surface 30a of the substrate 30. Second coplanar strips 32a and 32b are formed on the lower surface 30b. These strips are formed by vapor evaporation, sputtering, electroless plating, or the like, and are patterned by a micropatterning technique such as a photolithographic technique or a lift-off technique.

FIG. 7 shows an electric field distribution formed in the substrate 30. A transmission line for transmitting a TEM wave at a desired impedance is comprised of the first coplanar strips 31a and 31b. Therefore, a first electric field 33 corresponding to a voltage of a high-speed electrical signal applied between the strips 31a and 31b is formed in the substrate 30 near the upper surface 30a of the substrate 30. The second coplanar strips 32a and 32b form a second electric field 34 spaced apart from the electric field 33 formed by the first coplanar strips 31a and 31b. In other words, the second electric field 34 is formed near the lower surface of the substrate 30. The second coplanar strips 32a and 32b are not necessarily formed to cover the total area of the substrate 30. An arrow 35 in FIG. 7 indicates a z-axis of the substrate. This direction is parallel to the direction of the electric fields near the center of the two strips which form a coplanar structure. As shown in FIG. 8, a light beam 36 is incident from the upper surface 30a of the substrate 30 and is output from the lower surface 30b of the substrate 30 so as to pass between the first coplanar strips 31a and 31b and the second coplanar strips 32a and 32b. Each voltage to be applied to the corresponding coplanar strips has a polarity such that the directions of the first and second electric fields 33 and 34 are reversed. Therefore, as described in the first embodiment, the input light is modulated and re-store by an electrooptic effect, and a series of optical and electrical signal processing operations are performed.

In the third embodiment, as described in the first embodiment, it is apparent that a voltage (e.g., DC voltage) may be superposed on the re-storation voltage and the resultant voltage may be applied to the second coplanar strips so as to set an optimal operating point.

FOURTH EMBODIMENT

Figure 9:
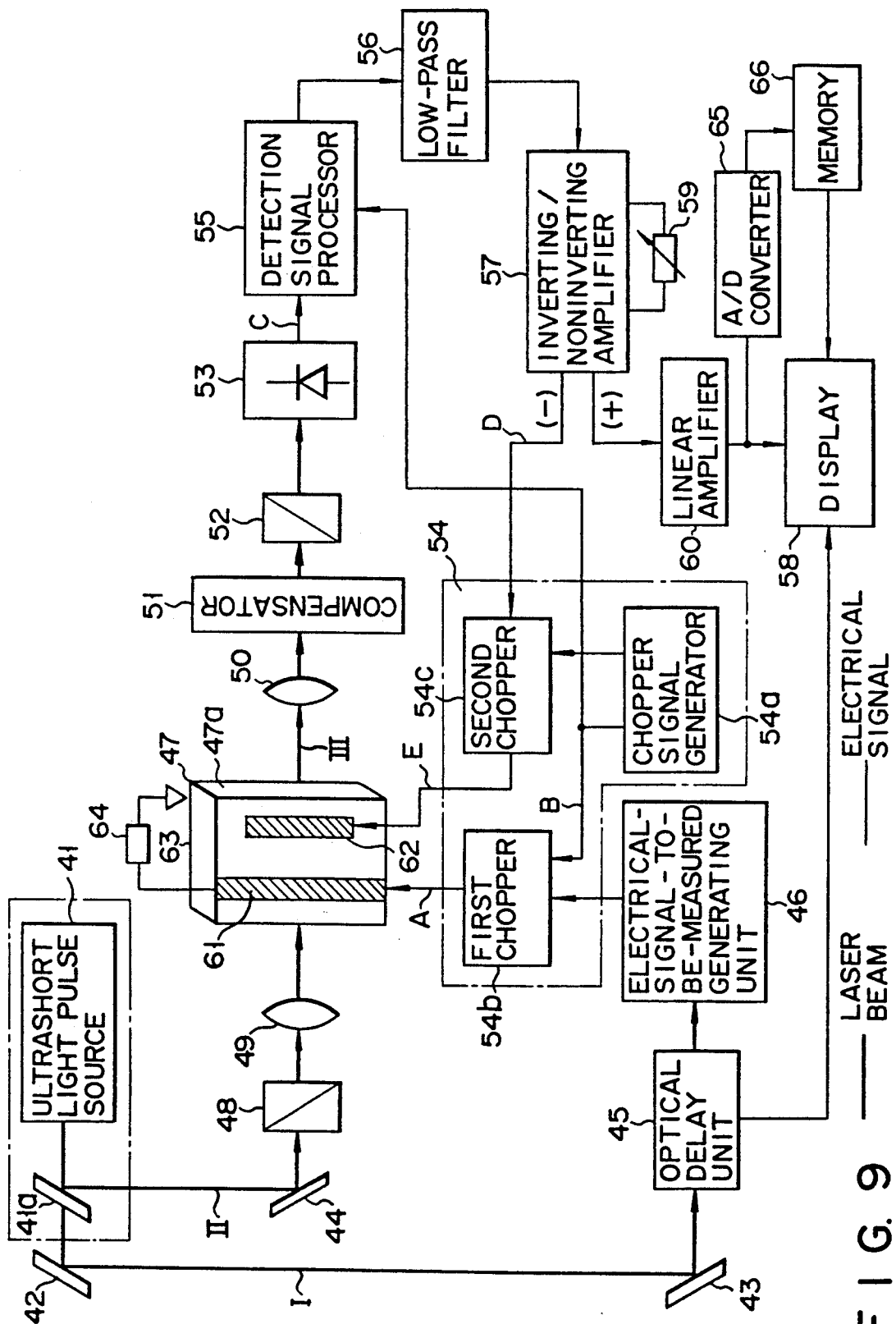
FIG. 9 is a block diagram showing an embodiment of an electrical signal waveform measuring apparatus using the electrooptic effect element according to the present invention.

FIG. 9 is a block diagram showing an embodiment of an electrical signal waveform measuring apparatus utilizing an electrooptic effect according to the present invention. FIG. 10 is a timing chart of electrical signal waveforms of signals A to E shown in FIG. 9.

Reference numeral 41 denotes a light source for generating light beam of ultrafast light pulse. The light source 41 outputs a first light beam I for generating a high-speed electrical signal and a light beam II for sampling which is synchronous with the first light beam I. For example, when a hybrid mode-locked dye laser or a CPM dye laser pumped by an Ar laser is used as the light source 41, a pulse repetition frequency is 82 MHz; a wavelength, 6,100 Å; and a pulse duration 1 picosecond or less. A solid-state laser consisting of, e.g., YAG, $T_i$: Sapphire, or $Cr^{3+}$: $BeAl_2O_4$, a laser diode can be employed as the light source 41.

Reference numerals 42, 43, and 44 denote mirrors for changing directions of the first and second light beam I and II of the ultrashort light pulse from the light source 41.

Reference numeral 45 denotes an optical delay unit for variably delaying the first light beam I of the ultrashort light pulse for generating the high-speed electrical signal through the mirrors 42 and 43 by a predetermined number of steps. For example, a corner reflector for providing a two-round path to the flux of the ultrashort light pulse and a stepping motor are used in the optical delay unit 45. The corner reflector is gradually moved in parallel to a traveling direction of the light by the stepping motor by a predetermined number of steps. The double moving amount serves a delay of the first light beam I of the ultrashort light pulse. The optical delay unit 45 outputs horizontal axis corresponding to the predetermined number of delay steps to a display 58 to be described later.

Reference numeral 46 denotes a unit for generating an electrical signal to be measured. The unit 46 has a photoconductive element for generating a trigger signal in response to the light beam of the ultrashort light pulse delayed by the optical delay unit 45 and generates an electrical signal to be measured synchronous with the second light beam II of the ultrashort light pulse for sampling, in response to the trigger signal.

Reference numeral 48 denotes a polarizer for linearly polarizing the second light beam II of the ultrashort light pulse for sampling by 45° with respect to a Z-axis of an electrooptic effect element 47 to be described later.

Reference numeral 49 denotes a lens for focusing the beam of the ultrashort light pulse which has passed through the polarizer 48, and for decreasing the diameter of the beam.

Reference numeral 47 denotes an electrooptic effect element. As described in the first embodiment, the electrooptic effect element 47 includes first electrode 63 formed on one surface of a substrate 47a, and second and third electrodes 61 and 62 formed on the other surface of the substrate 47a; The electrooptic effect element 47 polarizes the second light beam II of the ultrashort light pulse for sampling by a voltage representing a part of a high-speed electrical signal applied to the second electrode 61. When a low-frequency voltage is applied to the third electrode 62 and the ultrashort light pulse polarized by the second electrode 61 passes through the third electrode 62, polarized light is polarized in a reverse direction. The substrate 47a is an optical crystal of, e.g., lithium tantalate or lithium niobate.

Reference numeral 50 denotes a lens for collimating the light beam of the ultrashort light pulse passing through the electrooptic effect element 47.

Reference numeral 51 denotes a compensator for compensating static birefringence generated when the light beam of the ultrashort light pulse which has passed through the lens 50 then passes through the electrooptic effect element 47, and for setting an operating point using the electrooptic effect element 47.

Reference numeral 52 denotes an analyzer for linearly polarizing the ultrashort light pulse which has passed through the compensator 51, i.e., the elliptically polarized light beam, so as to be perpendicular to a polarization direction of the polarizer 48, thus modulating the intensity of the light pulse.

Reference numeral 53 denotes a photodetector consisting of, e.g., a photodiode, for converting the light pulse which has passed through the analyzer 52 and has been intensity-modulated into an electrical signal.

Reference numeral 54 denotes an electrical chopper.

Reference numeral 54a denotes a chopper signal generator which is one element constituting the chopper 54. The chopper signal generator 54a generates a chopper signal serving as a reference signal. The frequency of the chopper signal is set to reduce noise of a detection system and falls within the range of 1 kHz to several MHz in this apparatus.

Reference numeral 54b denotes a first chopper for electrically chopping the high-speed electrical signal generated by the electrical-signal-to-be-measured generating unit 46 in synchronism with the signal generated from the chopper signal generator 54a, and for transmitting the chopped signal to the second electrode 61 of the electrooptic effect element 47.

Reference numeral 54c denotes a second chopper for chopping a low-frequency electrical signal for polarizing the light beam in the direction opposite to a polarization direction by the electrical signal supplied to the second electrode 61 of the electrooptic effect element 47, in synchronism with the chopper signal generator 54a, and for transmitting the chopped signal to the third electrode 62 of the electrooptic effect element 47.

Reference numeral 55 denotes a detection signal processor for outputting a level difference between data obtained when the output detected by the photodetector 53 is subjected to intensity modulation and data obtained when the detected output is not subjected to intensity modulation (non-modulation) in accordance with the electrical signal including these two data. First, the detection signal processor 55 amplifies the electrical signal, and output the level difference between the modulated and nonmodulated electrical signals in response to the chopper signal from the chopper signal generator 54a.

Reference numeral 56 denotes a low-pass filter for reject an AC component from the detection signal processor 55 to pass therethough.

Note that a lock-in amplifier generally used as a very small electrical signal detector can be employed in place of the detection signal processor 55 and the lowpass filter 56.

Reference numeral 57 denotes an inverting/noninverting amplifier for receiving the electrical signal supplied from the low-pass filter 56, and amplifying and outputting the signal. In addition, the inverting/noninverting amplifier 56 includes an input terminal for electrically and arbitrarily setting an output level when the electrical signal is not supplied, and can output inverted and noninverted signals. Reference numeral 58 denotes a display in which the abscissa represents an amount of delay of the optical delay unit 45 in predetermined steps and the ordinate represents a noninverted output from the inverting/noninverting amplifier 57 via a linear amplifier 60 on coordinates.

Reference numeral 59 denotes a variable resistor for setting an operating point of the inverting/noninverting amplifier 57.

Reference numeral 60 denotes a linear amplifier for amplifying a noninverted output from the inverting/noninverting amplifier 57.

Reference numeral 64 denotes a terminal resistor connected to a terminal of the second electrode 61.

An operation of the apparatus with the above arrangement according to the present invention will be described hereinafter.

An ultrashort light pulse having a pulse duration of sub picosecond generated by light source 41 is split into the first light beam I of the ultrashort light pulse for generating a high-speed electrical signal and the second light beam II of the ultrashort light pulse for sampling by a beam splitter 41a in the light source, and the split beams are output from the splitter 41a. The first light beam I is transmitted through the mirrors 42 and 43, and the second light beam II is transmitted through the mirror 44.

The first light beam I which has passed through the mirrors 42 and 43 is guided to the optical delay unit 45, and delayed by the predetermined number of delay steps. The first light beam I synchronous with the second light beam II and which is delayed by the predetermined number of delay steps is guided to the photo-conductive element of the electrical-signal-to-be-measured generating unit 46 to cause the photoconductive element to generate a high-speed electrical signal having a trigger pulse train synchronous with the delayed light beam I.

The electrical-signal-to-be-measured generating unit 46 generates a trigger signal which synchronous with the second light beam II. A trigger signal of the electrical-signal-to-be-measured generating unit 46 trigger an IC, a high-speed transistor, or the like as an element to be measured (not shown) which is connected to the electrical-signal-to-be-measured generating unit 46. An output signal from the element to be measured is chopped by the first chopper 54b in response to a signal shown in FIG. 10B. Therefore, for example, a high-speed electrical signal having a chopped pulse train shown in FIG. 10A the output from the first chopper 54b and guided to the second electrode 61 of the electrooptic effect element 47, i.e., the microstrip line constituted by the second and first electrodes 61 and 63 (to be referred to as a microstrip line hereinafter), which terminating at the terminal resistor 64.

On the other hand, the second light beam II which has passed through the polarizer 48 is linearly polarized by 45° with respect to the Z-axis, as described above. The light beam focused by the lens 49 is incident on the electrooptic effect element 47, and passes through a high-frequency electric field formed by the microstrip line, and another electric field (electric field for re-storation) formed by the third and first electrodes (re-store electrodes) 62 and 63. Therefore, the second light beam II incident on the electrooptic effect element 47 is output from the electrooptic effect element 47 as a third light beam III elliptically polarized by the electrooptic effect of the electrooptic effect element 47.

The third light beam III of the ultrashort light pulse elliptically polarized and output from the electrooptic effect element 47 passes through the lens 50, the compensator 51, and the analyzer 52, and is converted into an electrical signal by the photodetector 53 as an intensity-modulated light. The resultant electrical signal is detected. Thus, the second light beam II equivalently converts a part of the electrical signal applied to the microstrip line of the electrooptic effect element 47 into a signal having a low-frequency electric pulse train while passing through the high-frequency electric field and electric field for restore. In other words, the electrical signal to be measured is sampled. In the electrical signal waveform measuring apparatus according to the present invention, each pulse of an output from the photodetector 53 consisting of, e.g., a detection photodiode has an insufficient level because the pulse duration of the light pulse for sampling is extremely small. Therefore, several to several hundreds of "OFF" and "ON" states are repeated by the first chopper 54b for each delay step generated by the optical delay unit 45. A plurality of detected outputs are sequentially output as integrated low-frequency DC signals. FIGS. 11A to 11D show general sampling process except for a chopper operation wherein the number of delay steps is changed for each pulse, in order to understand such a sampling operation, i.e., an E-O sampling system. Note that a pump light in FIGS. 11B and 11C represents the above-mentioned first light beam I.

In this case, an electrical signal I detected by the photodetector 53 can be obtained as follows:

$$I = I_k\{1+\cos(\delta+K_1V_1+K_2V_2)\} \quad \ldots (3)$$

where $V_1$ is a voltage applied to the microstrip line, $V_2$ is a voltage applied to the re-store electrode, $\delta$ is an optical bias amount determined in accordance with static birefringence of the electrooptic effect element 47 or a phase setting amount of the compensator 51, and $K_1$ and $K_2$ are coefficients determined in accordance with the above-mentioned arrangement of the electrode and the electrooptic effect element 47. Note that $I_K$ is a value proportional to an intensity of the light pulse for sampling.

In the sampling operation using the electrooptic effect, a bias amount $\delta$ is set to be approximately 90° ($\pi/2$) using the compensator in order to increase the detection sensitivity.

The detection signal processor 55 for receiving the electrical signal (FIG. 10C) detected by the photodetector 53, detects a difference between two electrical signals. That is, a detection signal obtained when the electrical signal of the element to be measured is in an "ON" state in response to the chopper signal (FIG. 10B), i.e., when the light beam of the light for smpling is modulated (to be referred to as "upon modulation" hereinafter), and a detection signal when the electrical signal of the element to be measured is in an "OFF" state, i.e., when the light beam of the light for sampling is not modulated (to be referred to as "upon non-modulation" hereinafter). This detection of the difference corresponds to the one by performing synchronous detection in response to the chopper signal.

Figure 10A:
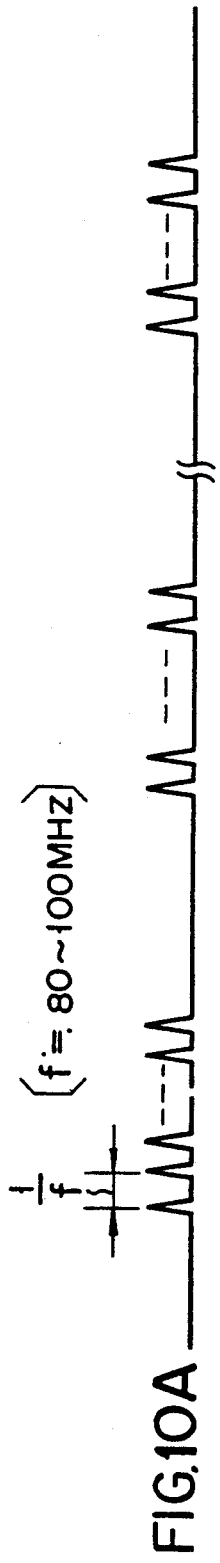
FIGS. 10A to 10E are timing charts showing electrical signal waveforms of units in the block diagram in FIG. 9.
Figure 10B:
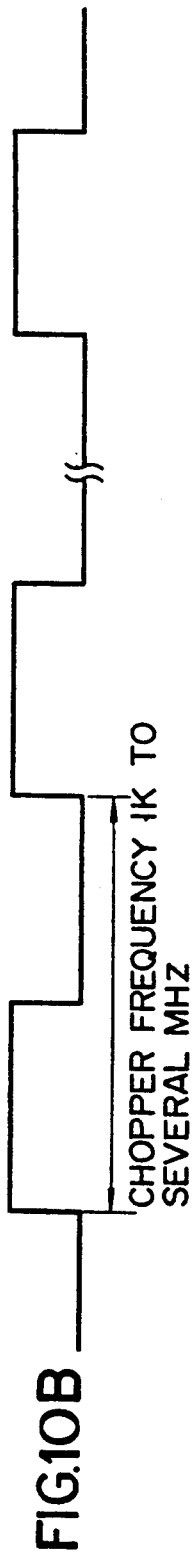
Figure 10C:
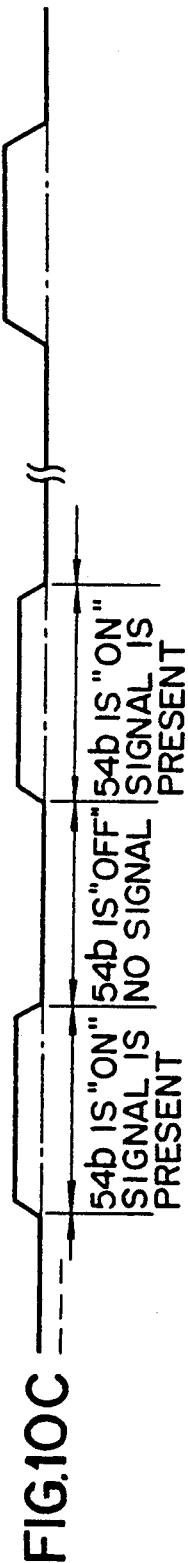
Figure 10D:
Figure 10E:
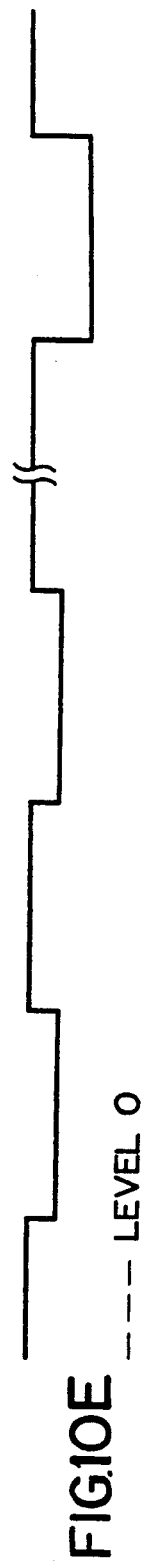

An output signal detected by the detection signal processor 55 passes through the low-pass filter 56 to serve as an electrical signal without a ripple (FIG. 10D). This electrical signal is amplified by the inverting/noninverting amplifier 57 at both inverting and noninverting levels. The amplified and inverted output signal is guided to the demodulation electrode (third electrode) 62 of the electrooptic effect element 47 as a signal (FIG. 10E) passing through the second chopper 54c at a timing upon modulation. Therefore, a closed loop of the sampling operation according to the present invention can be formed. With the arrangement of this closed loop, the ultrashort light pulse for sampling is polarized by the electric field (high-frequency electric field) of a voltage applied to the second electrode 61 microstrip line on the electrooptic effect element 47. The polarized light is further polarized in a direction for canceling the above-mentioned polarized ultrashort pulse light by the electric field (demodulation electric field) generated by the re-storation electrodes. Finally, the light beam III of the ultrashort light pulse output from the electrooptic effect element 47 is set in a non-polarization state by the closed-loop operation. More specifically, in the electric output signal from the photodetector 53, the level upon modulation coincides with that upon non-modulation (alternate long and short dashed line in FIG. 10C). At this time, the noninverted output level of the inverting/noninverting amplifier 57 is equal to a voltage of a part of the electrical signal to be measured. This voltage serves as a sampling voltage.

Therefore, a right-hand side of the above-described equation (3) is defined as follows:

$$I_K\cos(\delta+K_1V_1+K_2V_2)=I_K\cos\delta \quad \ldots (4)$$

therefore $K_1V_1 = -K_2V_2$, and $K_1 = K_2$.

More specifically, the polarity of the voltage to be applied to the second electrode 61 microstrip line is opposite to that of the voltage to be applied to the third electrode 62 serving as the re-store electrode, and the absolute amounts of these voltages are equal to each other.

In general, it is difficult that the second and third electrodes 61 and 62 have the same arrangement to obtain $K_1=K_2$. For this reason, a noninverted output from the inverting/noninverting amplifier 57 passes through the linear amplifier 60 for setting gain and attenuation. Therefore, the amount of $K_2/K_1$ is corrected so that the ultimate output voltage is equal to a voltage of a part of the high-speed electrical signal, and the corrected value may be output to the display 58.

At this time, the display 58 displays data of a horizontal axis from the optical delay unit 45, i.e., the light beam of the ultrashort pulse for generating an electrical signal to be measured, as a location of the horizontal axis which corresponds to the delayed predetermined number of delay steps, an output voltage from the linear amplifier 60 as data of a vertical axis. Therefore, the electrical signal waveform applied to the microstrip line second electrode 61 formed on the electrooptic effect element 47 can be observed in time resolution in units of picosecond. In practical, it takes about ten minutes to perform a sampling operation in the waveform observation of this type. Therefore, an output voltage for each delay step is not directly displayed on the display 58, but may be stored in the memory 66 through the A/D converter 65. Then, data for one waveform may be displayed on the display 58. In addition, the time resolution of waveform which can be observed is limited by not only the pulse duration of the ultrashort light pulse for sampling, but also the high-frequency characteristics of the microstrip line, as a matter of course.

As is understood from the equation (4), even if the optical bias amount δ is changed, the waveform of the high-speed electrical signal can be accurately measured.

As described above, the pulse duration Tg used to measure a voltage of a part of the high-speed electrical signal and a high-speed electrical signal waveform duration Tp must satisfy the condition 2Tg<<Tp. The pulse duration Tg determines the voltage resolution of the waveform observation. Furthermore, for delaying the light, the high-speed electrical signal generation light is fixed and light for sampling may be delayed in the opposite to the light delay as shown in FIG. 9.

As has been described in detail, the electrooptic effect element according to the present invention is different from the conventional element, and has the third electrode (or the second coplanar strips in a case where the electrode is of a coplanar type). Therefore, the light modulated by the high-frequency electric field of the second electrode (or the first coplanar strips in a case where the electrode is of a coplanar type) can be restore to the original state by the voltage applied to the third electrode (or the second coplanar strips). More specifically, as described above, since a compensation-type detection system can be employed, the precision (accuracy) of the measuring system can be improved, and drift due to a change in temperature can be canceled. Since the third electrode has a function of a control electrode for setting an operating point, the electrooptic effect element of the present invention ca easily set the operating point. In addition, in the electrical signal waveform measuring apparatus for measuring the waveform of the electrical signal using the electrooptic effect element according to the present invention, the electrical signal to be measured is supplied between the second and first electrodes, and an electrical signal having an opposite polarity of the electrical signal to be measured is supplied between the third and first electrodes. A closed loop is formed by the optical and electric systems so that the polarized light is canceled when the sampling light passes through the electrooptic effect element in response to these two signals, and the electrical signal supplied between the second and third electrodes is measured on the display. Therefore, an influence to the waveform measurement of the electrical signal such as a change in birefringence due to a temperature change, difficulty of adjustment of the compensator, the nonlinear detection characteristics, a change in light source, and the like can be suppressed, and degradation of precision can be automatically corrected, thus achieving a stable measurement operation of the electrical signal waveforms.

The present invention can be applied as a sampling oscilloscope using an E-O sampling system for directly observing the characteristics of each device, e.g., a leading waveform when the speed of the high-speed electronic device is estimated.

We claim:

1. A coplanar electrooptic effect element, comprising:

a substrate comprised of a material having an electrooptic effect, said substrate having opposite major surfaces and a Z axis which extends medially of said major surfaces;

a pair of first coplanar strips, formed on one surface of said substrate, for forming a high-frequency electric field in a region between said first coplanar strips near said one surface; and a pair of second coplanar strips, formed on the other surface of said substrate and sandwiching said substrate together in relation to said first coplanar strips, for forming another electric field in a region between said second coplanar strips near said other surface, said other field being different from the high-frequency electric field formed by said first coplanar strips near said one surface;

wherein the direction of said high-frequency field and said other field become parallel to the Z axis of said substrate near a center of said first coplanar strips and said second coplanar strips.

2. An apparatus for measuring a waveform of an electrical signal, using a light source for outputting first and second light beams and an electrooptic effect element, said electrooptic effect element comprising second and third electrodes and a first electrode opposing said second and third electrodes, for polarizing a second light beam passing therethrough by a voltage representing a part of a waveform to be measured, the voltage being applied to said second electrode, comprising:

an optical delay unit for delaying a first light beam by a predetermined time period;

an electrical-signal-to-be-measured generating unit triggered by said first light beam delayed by said optical delay unit, for outputting a voltage of the part of the electrical signal waveform to be measured to said electrooptic effect element;

a photodetector for converting said second light beam polarized by the voltage of the part of the electrical signal waveform to be measured and output from said electrooptic effect element into an electrical signal;

a chopper for chopping voltages applied to said second and third electrodes of said electrooptic effect element in synchronism with each other;

a detection signal processor for outputting a level difference between a nonmodulated electrical signal output from said photodetector during an "OFF" mode, and a modulated electrical signal output from said photodetector during an "ON" mode;

a low-pass filter for passing a difference signal between the two electrical signals output from said detection signal processor;

a differential amplifier for receiving the difference signal between the two electrical signals which passed through said low-pass filter, and for outputting an inverted signal of the difference signal to said third electrode to form a feedback loop; and a display for displaying a noninverted output from said differential amplifier as data of a vertical axis at a location of a horizontal axis corresponding to a desired number of delay steps of said optical delay unit.

3. The apparatus of claim 2, wherein said electrooptic effect element further comprises:

a substrate comprised of a material having an electrooptic effect, said substrate having opposite surfaces;

said first electrode being formed on one of said opposite surfaces of said substrate;

said second electrode being formed on the other of said opposite surfaces of said substrate, said second electrode constituting a microstrip line together with said first electrode, for forming a high-frequency electrical field with respect to a path of a light beam in said substrate; and said third electrode being spaced from said second electrode on said other opposite surface of said substrate, for forming, together with said first electrode, an electric field different from high-frequency electric field formed by said second electrode with respect to the path of the light beam in said substrate.

4. The apparatus of claim 3, wherein said third electrode comprises a plurality of electrodes.

5. An apparatus for measuring a waveform of an electrical signal, using a light source for outputting first and second light beams and an electrooptic effect element, said electrooptic effect element comprising:

a substrate comprised of a material having an electrooptic effect;

first coplanar strip means, formed on said substrate, for forming a high-frequency electric field with respect to a path of a light beam in said substrate, to thereby modulate the light beam; and second coplanar strip means, formed on said substrate, for forming an electric field different from the high-frequency electric field formed by said first coplanar strip means with respect to the path of the light beam in said substrate, to thereby restore the light beam modulated by said first coplanar strip means, said electrooptic element being polarized by said second light beam passing therethrough, by a voltage representing a part of a waveform to be measured, the voltage being applied to said first coplanar strip means, said apparatus comprising:

an optical delay unit for delaying said first light beam by a predetermined time period;

an electrical-signal-to-be-measured generation unit triggered by said first light beam delayed by said optical delay unit, for outputting to said electrooptic effect element a voltage representing a part of the electrical signal waveform to be measured;

a photodetector for converting into an electrical signal said second light beam polarized by said voltage representing said part of the electrical signal waveform to be measured and output from said electrooptic effect element;

a chopper for chopping voltage applied to said first and second coplanar strip means of said electrooptic effect element in synchronism with each other;

a detection signal processor for outputting a level difference between a nonmodulated electrical signal output from said photodetector during an "OFF" mode, and a modulated electrical signal output from said photodetector during an "ON" mode;

a low-pass filter for passing difference signal between the two electrical signals output from said detection signal processor;

a differential amplifier for receiving the difference signal between the two electrical signals which passed through said low-pass filter, and for outputting an inverted signal of the difference signal to said second coplanar strip means, to form a feedback loop; and a display for displaying a noninverted output from said differential amplifier as data of a vertical axis at a location of a horizontal axis corresponding to a desired number of delay steps of said optical delay unit.

* * * * *

UNITED STATES PATENT AND TRADEMARK OFFICE
CERTIFICATE OF CORRECTION

PATENT NO. : 5,012,183
DATED : April 30, 1991
INVENTOR(S) : KAWANO et al It is certified that error appears in the above-identified patent and that said Letters Patent is hereby corrected as shown below:

Title page, Section [86] PCT No.:

Change International Application No. "PCT/JP89/01071" to

--PCT/JP88/01071--.

Signed and Sealed this

Eighth Day of December, 1992

*Attest:*

DOUGLAS B. COMER

*Attesting Officer*      *Acting Commissioner of Patents and Trademarks*